(12) United States Patent
Nojima et al.

(10) Patent No.: US 7,890,908 B2
(45) Date of Patent: Feb. 15, 2011

(54) METHOD FOR VERIFYING MASK PATTERN DATA, METHOD FOR MANUFACTURING MASK, MASK PATTERN VERIFICATION PROGRAM, AND METHOD FOR MANUFACTURING SEMICONDUCTOR DEVICE

(75) Inventors: Shigeki Nojima, Yokohama (JP); Yoko Oikawa, Tokyo (JP); Satoshi Tanaka, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 367 days.

(21) Appl. No.: 11/472,441

(22) Filed: Jun. 22, 2006

(65) Prior Publication Data
US 2007/0006115 A1 Jan. 4, 2007

(30) Foreign Application Priority Data
Jun. 24, 2005 (JP) ............................. 2005-185194

(51) Int. Cl.
*G06F 17/50* (2006.01)
(52) U.S. Cl. .................. 716/12; 716/2; 716/4; 716/19
(58) Field of Classification Search .................. 716/2, 716/4, 12, 19
See application file for complete search history.

(56) References Cited

U.S. PATENT DOCUMENTS

| | | | |
|---|---|---|---|
| 6,038,020 A | | 3/2000 | Tsukuda |
| 6,285,783 B1 * | | 9/2001 | Isomura et al. ............. 382/147 |
| 6,913,861 B2 * | | 7/2005 | Shishido et al. ............... 430/30 |
| 7,039,889 B2 * | | 5/2006 | Takahashi et al. .............. 716/9 |
| 7,402,897 B2 * | | 7/2008 | Leedy ......................... 257/678 |
| 2005/0204327 A1 | | 9/2005 | Mukai et al. |
| 2006/0008135 A1 | | 1/2006 | Nojima |
| 2006/0062445 A1 * | | 3/2006 | Verma et al. ................. 382/144 |

FOREIGN PATENT DOCUMENTS

| | | |
|---|---|---|
| JP | 09-319067 | 12/1997 |
| JP | 2000-260879 | 9/2000 |

(Continued)

OTHER PUBLICATIONS

Newmark et al., "Large Area Optical Proximity Correction Using Pattern Based Corrections", SPIE, vol. 2322, Photomask Technology and Management, pp. 374-386, (1994).

(Continued)

*Primary Examiner*—Thuan Do
(74) *Attorney, Agent, or Firm*—Finnegan, Henderson, Farabow, Garrett & Dunner, L.L.P.

(57) ABSTRACT

A method for verifying mask pattern data includes preparing design circuit data on a design circuit which realizes a desired electrical operation. Data on a design circuit pattern having a structure which realizes the design circuit on a semiconductor substrate is prepared. Mask pattern data on a pattern of a mask used in order to produce the design circuit pattern is prepared. A circuit pattern which is to be obtained by processing a film using the pattern of the mask indicated by the mask pattern data is acquired. Circuit data on a circuit realized by at least a first part of the circuit pattern is produced. A circuit mismatch part where the circuit data and a part of the design circuit data which corresponds to the first part of the circuit pattern do not match up is detected.

19 Claims, 6 Drawing Sheets

FOREIGN PATENT DOCUMENTS

JP    2003-107664    4/2003

OTHER PUBLICATIONS

Notification of Reasons for Rejection from the Japanese Patent Office, mailed Dec. 16, 2008, in copending App. No. 2005-185194 and English-language translation thereof.

Yong-Chan Ban et al, "A Fast Lithography Verification Framework for Litho-Friendly Layout Design," Sixth International Symposium on Quality of Electronic Design, IEEE, Mar. 21 to 23, 2005, pp. 169-174.

* cited by examiner

METHOD FOR VERIFYING MASK PATTERN DATA, METHOD FOR MANUFACTURING MASK, MASK PATTERN VERIFICATION PROGRAM, AND METHOD FOR MANUFACTURING SEMICONDUCTOR DEVICE

CROSS-REFERENCE TO RELATED APPLICATIONS

This application is based upon and claims the benefit of priority from prior Japanese Patent Application No. 2005-185194, filed Jun. 24, 2005, the entire contents of which are incorporated herein by reference.

BACKGROUND OF THE INVENTION

1. Field of the Invention

The present invention relates to a method for verifying mask pattern data, a method for manufacturing a mask, a mask pattern data verification program, and a method for manufacturing a semiconductor device.

2. Description of the Related Art

In recent years, semiconductor device manufacturing techniques have been markedly improved; semiconductor devices of minimum machining size 70 nm are now mass produced. Such a shrink has been achieved by rapid progresses in fine pattern formation techniques such as mask process techniques, optical lithography techniques, and etching techniques. When circuit patterns on semiconductor substrates were large enough, a circuit pattern was able to be formed on a substrate almost as designed by drawing the planar shape of a circuit pattern desired to be formed on a semiconductor substrate faithfully as a design circuit pattern, producing a mask pattern that corresponds exactly to the design circuit pattern, using a projective optical system to transfer the mask pattern to the substrate, and etching an underlayer. However, the reduced sizes of circuit patterns have made it difficult to faithfully form a circuit pattern in each process. As a result, the finished size of the circuit pattern may disadvantageously be different from the size of the design circuit pattern.

In particular, in a lithography and etching processes, a circuit pattern arranged around a marked circuit pattern to be formed significantly affects the dimensional accuracy of the marked circuit pattern. The lithography and etching processes are most important in achieving micromachining. It is thus important to increase the accuracy of circuit pattern dimensions in these processes.

Thus, to avoid these adverse effects, techniques called optical proximity correction (OPC) and process proximity correction (PPC) have been developed. These techniques pre-add an auxiliary pattern to a mask pattern or increase or reduce the width of the mask pattern so that the machined circuit pattern has the same dimensions as those of the design circuit pattern (desired values).

The techniques for optical proximity correction and process proximity correction have been reported in Jpn. Pat. Appln. KOKAI Publication Nos. 09-319067 and 2003-107664, SPIE Vol. 2322 (1994) 374 Large Area Optical Proximity using Pattern Based Correction, D. M. Newmark et. al. These techniques enable a circuit pattern on a semiconductor substrate as designed.

A mask pattern produced via the optical proximity correction or process proximity correction is verified to see if it enables to form a circuit pattern as designed. Recently, more stringent requirements for micromachining have made it more difficult to finish a circuit pattern as designed. This makes the conventional verification methods improper.

BRIEF SUMMARY OF THE INVENTION

According to an aspect of the present invention, there is provided a method for verifying mask pattern data comprising: preparing design circuit data on a design circuit which realizes a desired electrical operation; preparing data on a design circuit pattern having a structure which realizes the design circuit on a semiconductor substrate; preparing mask pattern data on a pattern of a mask used in order to produce the design circuit pattern; acquiring a circuit pattern which is to be obtained by processing a film using the pattern of the mask indicated by the mask pattern data; producing circuit data on a circuit realized by a first verification target pattern which is at least a part of the circuit pattern; and detecting a circuit mismatch part where the circuit data and a part of the design circuit data which corresponds to the first verification target pattern do not match up.

According to an aspect of the present invention, there is provided a program for verifying mask pattern data, the program making a computer execute procedures comprising: preparing mask pattern data on a pattern of a mask used to process a film in order to produce a design circuit pattern on a semiconductor substrate, the design circuit pattern having a structure which realizes a circuit indicated by the design circuit data, the design circuit data including information on a design circuit which realizes a desired electrical operation; acquiring a circuit pattern which is to be obtained by processing the film using the pattern of the mask indicated by the mask pattern data; producing circuit data on a circuit realized by a first verification target pattern which is at least a part of the circuit pattern; and detecting a circuit mismatch part where the circuit data and a part of the design circuit data which corresponds to the first verification target pattern do not match up.

DETAILED DESCRIPTION OF THE INVENTION

The inventors have obtained the following knowledge through development of the present invention.

As described above, in recent years, increased requirements are imposed on micromachining. This has made it difficult to finish a circuit pattern as designed even with OPC and (or) PPC (hereinafter simply referred to as proximity correction).

The current common proximity correction technique is intended to finish a circuit pattern as designed. In other words, a determination criterion for verification of the shape of a mask pattern is that a circuit pattern formed using a mask pattern subjected to the proximity correction "matches a circuit design pattern".

This results in a problem with verification of a mask pattern formed using the proximity correction. This problem will be described with reference to FIG. 1.

A mask pattern is verified by comparing a design circuit pattern with a circuit pattern formed on a substrate using a mask pattern formed via the proximity correction. A circuit pattern is obtained by simulation using mask pattern data or actually producing the circuit pattern using an actually manufactured mask.

Figure 1:
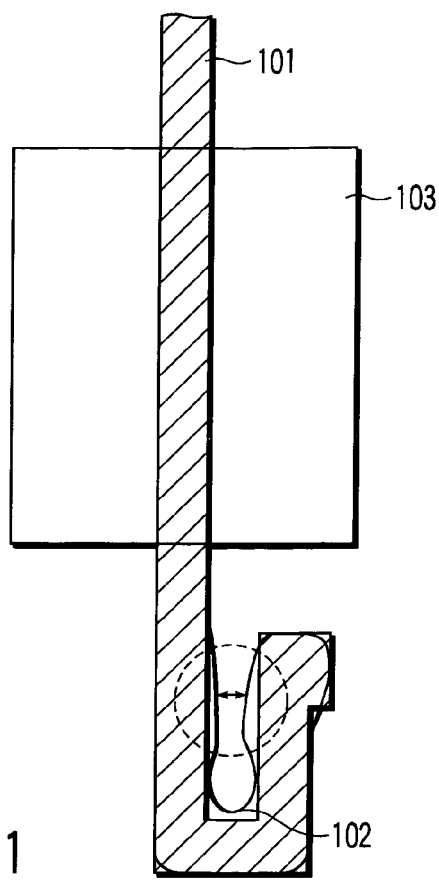
FIG. 1 is a diagram showing a design pattern and a circuit pattern resulting from simulation.

FIG. 1 shows a design circuit pattern and a circuit pattern resulting from simulation. In FIG. 1, reference numeral 101 denotes a design circuit pattern. Reference numeral 102 denotes the result of simulation using mask pattern data obtained by executing the proximity correction on the design circuit pattern. The simulation result corresponds to the shape of a circuit pattern that would be provided on a substrate by reproducing a lithography step using the mask pattern. Conditions for the simulation are an exposure light wavelength of 193 nm, NA=0.68, σ=0.75, and $\sigma_{in}$=0.5. Reference numeral 103 denotes an active area.

The circuit pattern resulting from the simulation is compared with the design circuit pattern to verify the shape of the mask pattern. If the shape of the circuit pattern matches that of the design circuit pattern, the mask pattern is determined to be appropriate. On the other hand, if the shape of the circuit pattern deviates from that of the design circuit pattern, the mask pattern is determined to be defective. As a result, the proximity correction is reviewed or the design circuit pattern is modified.

In the example shown in FIG. 1, the shape of the circuit pattern 102 matches that of the design circuit pattern 101 in their parts that overlap the active area 103. In other words, in this part, the finished circuit pattern is the "same as the design circuit pattern" and is determined to be appropriate. In contrast, the shape of the circuit pattern deviates from that of the design circuit pattern in a part enclosed by a broken line (part of the design circuit pattern 101 which is bent like the letter U). In other words, the distance between circuit patterns is different from the distance between design circuit patterns. This part is thus determined to be inappropriate.

However, the part of the circuit pattern to which the solid arrow points does not affect circuit operation even if it is wider than the corresponding part of the design circuit pattern. Accordingly, such a part originally need not be determined to be "inappropriate" even if the circuit pattern and the design circuit pattern are different in shape. Thus, if those parts which does not affect the circuit operation are determined to be "inappropriate", extra effort is required, for example, real candidate with potential to affect the circuit operation must be sort out among parts branded as defective. The current automated verification method cannot determine as appropriate parts in which the circuit pattern and the design circuit pattern are different in shape but which do not affect the circuit operation.

With reference to the drawings, description will be given of embodiments of the present invention configured on the basis of the above knowledge. In the description below, components having substantially the same functions and arrangements are denoted by the same reference numerals. Duplicate descriptions will be given only when required.

First Embodiment

Figure 2:
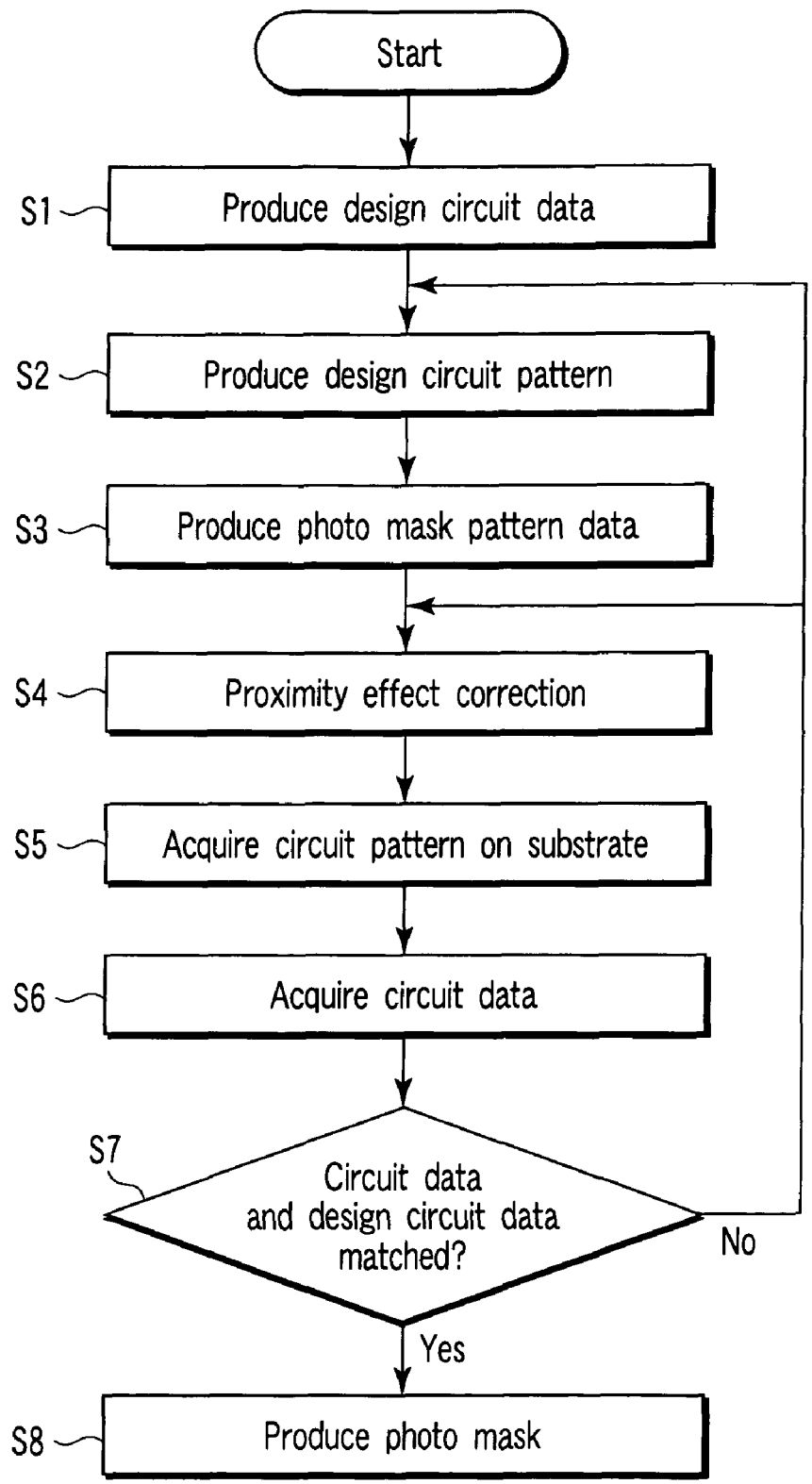
FIG. 2 is a flowchart showing a method for verifying mask pattern data and a method for manufacturing a mask according to a first embodiment.

With reference to FIG. 2, description will be given of a method for verifying (producing) mask pattern data and a method for manufacturing a mask according to a first embodiment. FIG. 2 is a flowchart showing the method for verifying mask pattern data and the method for manufacturing a mask according to the first embodiment of the present invention.

Figure 3:
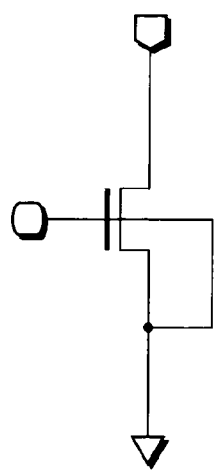
FIG. 3 is a diagram showing an example of part of design circuit diagram data.

As shown in FIG. 2, first, a design circuit diagram (design circuit data) is produced which performs a desired operation. The design circuit data is stored in a database. FIG. 3 shows an example of part of design circuit data. FIG. 3 illustrates a transistor.

Then, in FIG. 2, a design circuit pattern which realizes a design circuit on a process substrate is produced on the basis of the design circuit data (step S2). The design circuit pattern has a shape required to define the shape and position of a diffusion layer to constitute a transistor, the planar shapes, widths, and positions of a conductive film and an insulating film, and the arrangement of contact plugs, in accordance with the design circuit data; the diffusion layer.

The process substrate represents a substrate of target of a lithography process and includes a semiconductor substrate and one or more conductive films and insulating films which are formed on the semiconductor substrate in accordance with which lithography step it is referred in. Such a substrate is hereinafter simply referred to as a substrate or as a semiconductor substrate.

A mask pattern (mask pattern data) is then produced on the basis of the design circuit pattern (step S3). The mask pattern has a pattern required to realize the design circuit pattern on the substrate. To produce mask pattern data from the design circuit data, for example, a format called GDSII is often used. However, an EDA vendor may also be used. The mask pattern data is stored in the database.

The proximity correction is then executed on mask pattern data on a layer that needs to be micromachined (step S4). The proximity correction involves alteration on the shape of a target mask pattern while considering optical proximity effect by an exposure apparatus and possible shape change on the substrate. The proximity correction includes optical proximity correction and/or proximity correction. The process in step S4 results in production of mask pattern data which has experienced the proximity correction. In the description below, the mask pattern data includes the corrected mask pattern data.

The shape of a circuit pattern is then acquired which is expected to be obtained on the substrate by means of processing using a mask realized by the mask pattern data (step S5).

The shape of the circuit pattern is obtained by, for example, reproducing, by simulation, a lithography process using the mask pattern data. The shape of the circuit pattern may also be obtained by actually producing a mask in accordance with the mask pattern data and using the mask to actually form a circuit pattern on the substrate.

The simulation is executed taking into account exposure conditions, the optical proximity effect of the exposure apparatus, the mutual adverse effects of patterns on the substrate, the process proximity effect, and the like. If an actual mask is used, it is used to transfer the circuit pattern to a mask material, which is then used to etch the substrate. The circuit pattern thus obtained is observed through an electron microscope to acquire the shape of the circuit pattern.

Figure 4:
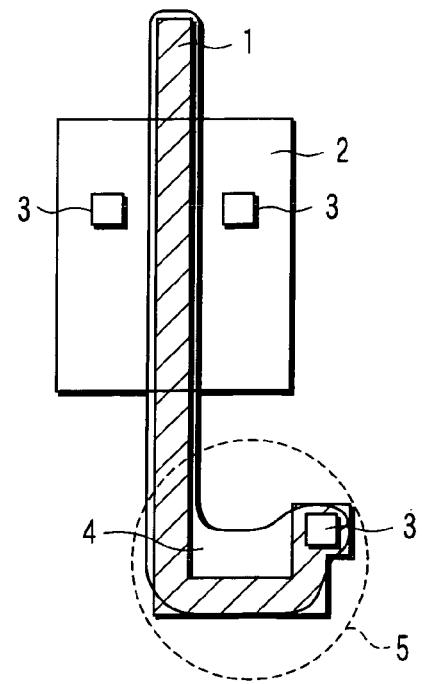
FIG. 4 is a diagram showing a circuit pattern resulting from simulation or actual processing.

FIG. 4 illustrates a circuit pattern obtained by simulation or actual processing in step S5. FIG. 4 corresponds to results for the design circuit data shown in FIG. 3. FIG. 4 also shows a design circuit pattern placed so as to overlap the circuit pattern.

In FIG. 4, reference numeral 1 denotes a gate wiring layer in a design circuit pattern. The gate wiring layer 1 passes over the active area 2 and is bent like the letter U. A contact plug (via plug) 3 is provided at the tip of the bent part. Contact plugs 3 are also provided on the active area 2. Reference numeral 4 denotes a conductive layer of the circuit pattern.

As shown in FIG. 4, in a part of the circuit pattern 4 which passes over the active area, the shape of the design circuit pattern 2 is almost the same as that of the circuit pattern 4. On the other hand, in a U-shaped part (enclosed by a broken line) 5, two opposite parts of the circuit pattern 4 are integrally connected together. This indicates that a reduced design rule prevents the conductive film from being etched at a sufficient resolution even with the proximity correction.

Then, as shown in FIG. 2, steps S6 to S8 are executed to verify the mask pattern data. More specifically, data on a circuit and circuit connection realized by the shape of the circuit pattern is acquired from the circuit pattern shape (step S6). For example, a well-known technique called Layout Versus Schematics (LVS) can be used to obtain the data (circuit data).

As shown in FIG. 4, the U-shaped part 5 of the gate wiring layer 1 is integrated in contrast to the design circuit pattern. However, this integration does not affect the circuit and circuit connection conditions realized by the circuit pattern 4 shown in FIG. 4. Consequently, the circuit data on the circuit pattern 4 provides the same design circuit diagram as that shown in FIG. 4.

During acquisition of the circuit data, if the distance between two adjacent parts of the circuit pattern is smaller than a certain threshold, the two parts can be determined to be integrated. The threshold can be set equal to, for example, half of minimum value of the design rule.

If the width of linear part of the circuit pattern is smaller than a certain threshold, parts to be connected by the linear part can be determined to be unconnected.

The circuit data acquired is compared with the design circuit data to detect mismatch parts (circuit mismatch parts) between the circuit data and the design circuit data (step S7).

If a part of the circuit pattern is shaped as shown in FIG. 4, the circuit data on this part of the circuit pattern is determined to be the same as that on the corresponding part of the design circuit pattern. LSV can be used to execute together the series of operations which include the acquisition of circuit data in step S6 and the comparison of the circuit data with the design circuit data in step 7

Figure 5:
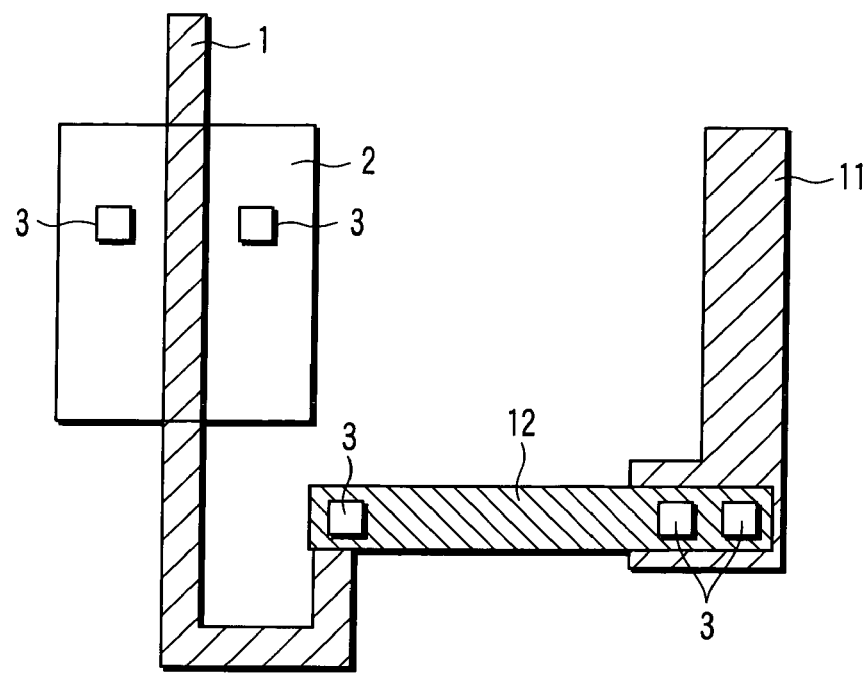
FIG. 5 is a diagram showing another example of a design circuit pattern.
Figure 6:
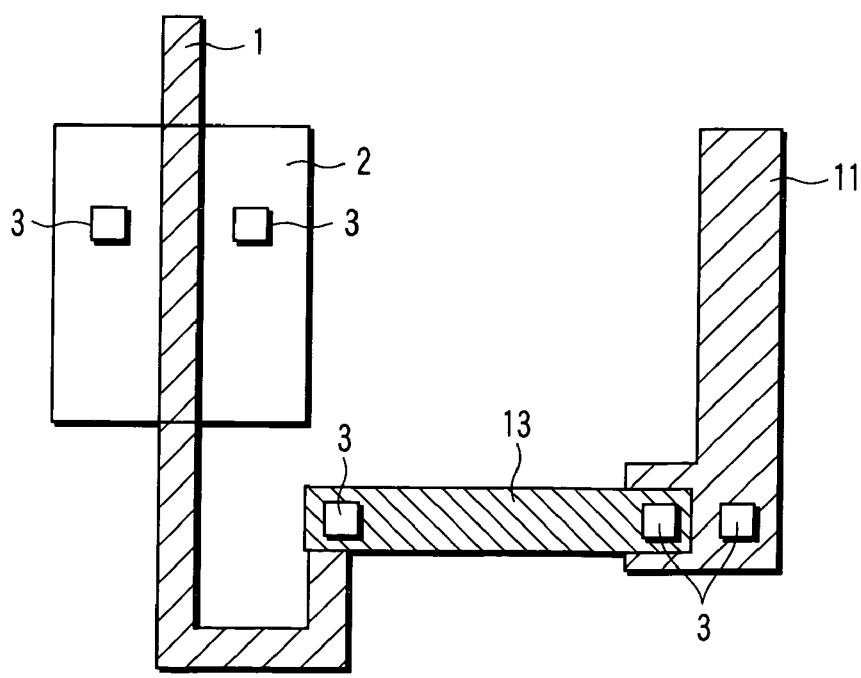
FIG. 6 is a diagram showing a circuit pattern obtained in accordance with the design circuit pattern in FIG. 5.

Description will be given of another example of verification of the match between circuit data. FIG. 5 shows another example of a design circuit pattern. FIG. 6 shows a circuit pattern obtained in accordance with the design circuit pattern shown in FIG. 5. A technique called double via is recently used. This technique provides multiple via plugs that connect lower layer wiring to upper layer wiring. As shown in FIG. 5, two adjacent via plugs 3 connect a wiring layer 11 and an overlying wiring layer 12. The wiring layer 12 covers the top surfaces of the two via plugs 3.

On the other hand, in FIG. 6, a wiring layer 13 does not reach the top surface of one of the via plugs 3. Thus, if the shape of this part is used to determine whether or not the circuit pattern is appropriate, this part is determined to be defective. However, when circuit data is acquired from the circuit pattern shown in FIG. 6 and is then compared with the design circuit data, the circuit data matches the design circuit data.

Detection of circuit mismatch parts continues until no more circuit mismatch parts are detected for the entire circuit pattern. Specifically, if the determination is NO in step S7, the process shifts to step S2 or S4. In step S2 or S4, the design circuit pattern is changed (step S2) or the proximity correction is re-executed after review on the conditions (step S4) so as to allow the mask pattern which is being produced to realize the design circuit.

Acquisition of a circuit pattern in step S5 and production of circuit data in step S6 are carried out again. The processes between steps S2 and S6 are repeated until no more circuit mismatch parts are detected.

When the circuit data matches the design circuit data in all parts, the process shifts to step S8. In step S8, a mask is produced in accordance with mask pattern data resulting from the above process.

In the above description, the mask pattern data is corrected so as to eliminate the circuit mismatch parts. However, a mask may be produced without correcting the circuit mismatch parts before lithography and etching are carried out using this mask with lithography and etching conditions adjusted on the basis of information on the circuit mismatch parts.

Figure 7:
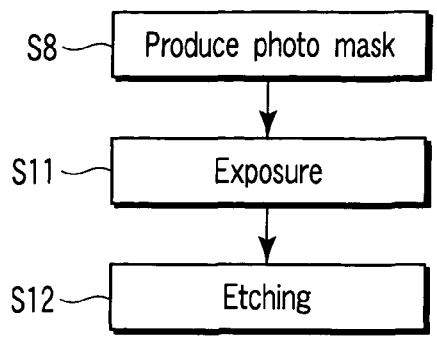
FIG. 7 is a flowchart showing a process using a mask.

Subsequently, as shown in FIG. 7, the mask produced by the process shown in FIG. 2 may be used to manufacture a semiconductor device. Specifically, during the manufacture of a semiconductor device, a patterning target film (e.g. a conductive film to be processed into a wiring layer) is formed on the semiconductor substrate, and a process target film (example, a photo resist) is formed on the patterning target film. The mask is then placed between a process target film and an exposure light source in an exposure apparatus. The process target film is then exposed by the exposure apparatus via the mask to transfer the pattern to the process target film (step S11). The process target film is then used as a mask to carry out etching to form a pattern on the process target film on the semiconductor substrate (step S12).

The processing between steps S1 and S8 may be executed by an information processing apparatus such as a computer and a program that allows the information processing apparatus to execute the procedure of steps S1 to S8.

Figure 8:
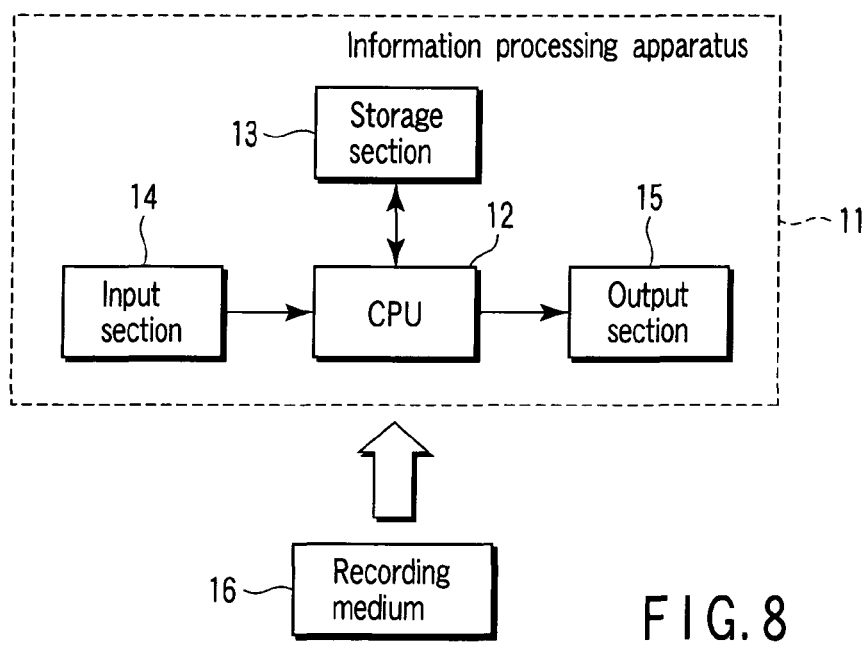
FIG. 8 is a diagram illustrating a configuration that allows an information processing apparatus to execute the method for manufacturing mask pattern data according to the first embodiment.

FIG. 8 illustrates a configuration that allows an information processing apparatus to execute the method for verifying (manufacturing) mask pattern data according to the first embodiment. As shown in FIG. 8, an information processing apparatus 11 has at least a central processing unit (CPU) 12, a storage section 13, an input section 14, and an output section 15.

The storage section 13 includes, for example, a read only memory (ROM) and a random access memory (RAM). The storage section 13 temporarily stores an execution program which is contained in a recording medium 16 described below and allows the information processing apparatus 11 to execute the above method for verifying (manufacturing) mask pattern data.

ROM stores, for example, control programs used by CPU 12. RAM is a volatile memory used as a work area for CPU 12 to store various programs such as control programs.

CPU 12 is manages the operation of the entire information processing apparatus 11. For example, when the information processing apparatus receives power supply, CPU 12 loads firmware (control program) stored in ROM, onto RAM to execute a predetermined process. CPU 12 then executes a process for the method for verifying mask pattern data, in accordance with the control program and an execution program read from the recording medium.

The input section 14 includes an interface function for inputting, for example, conditions and numerical values required for a predetermined process, to the information processing apparatus. The output section 15 outputs various kinds of information including, for example, the progress and results of processing. The output section 15 may include, for example, a display that displays such information.

Execution programs are stored in the recording medium 16. Alternatively, the execution programs may be stored in a magnetic disk (hard disk) serving as a part of the storage section 13. The recording medium 16 may be a magnetic disk such as a Floppy™ disk, an optical disk such as CD or DVD, or a semiconductor memory. Alternatively, the execution programs may be transmitted to the information processing apparatus via communication media.

The present invention is described taking the case of a photo mask for exposure. However, the present embodiment and the embodiments described below are applicable to verification of drawing data used for an electron beam (EB) direct drawing scheme.

According to the method for verifying mask pattern data according to the first embodiment, mask pattern data is verified through a comparison of design circuit data with circuit data on a circuit pattern obtained using the mask pattern data. Thus, even if the shape of the circuit pattern does not match that of the design circuit pattern, the shape mismatch part is determined not to be a correction target as long as a circuit realized by the shape mismatch part is the same as the corresponding design circuit. This reduces the time for verifying (producing) mask pattern data, thus making it possible to provide an efficient method for verifying (producing) mask pattern data.

Second Embodiment

A second embodiment concerns addition of a comparing step of the shape of a design circuit pattern with that of a circuit pattern to the first embodiment plus.

Figure 9:
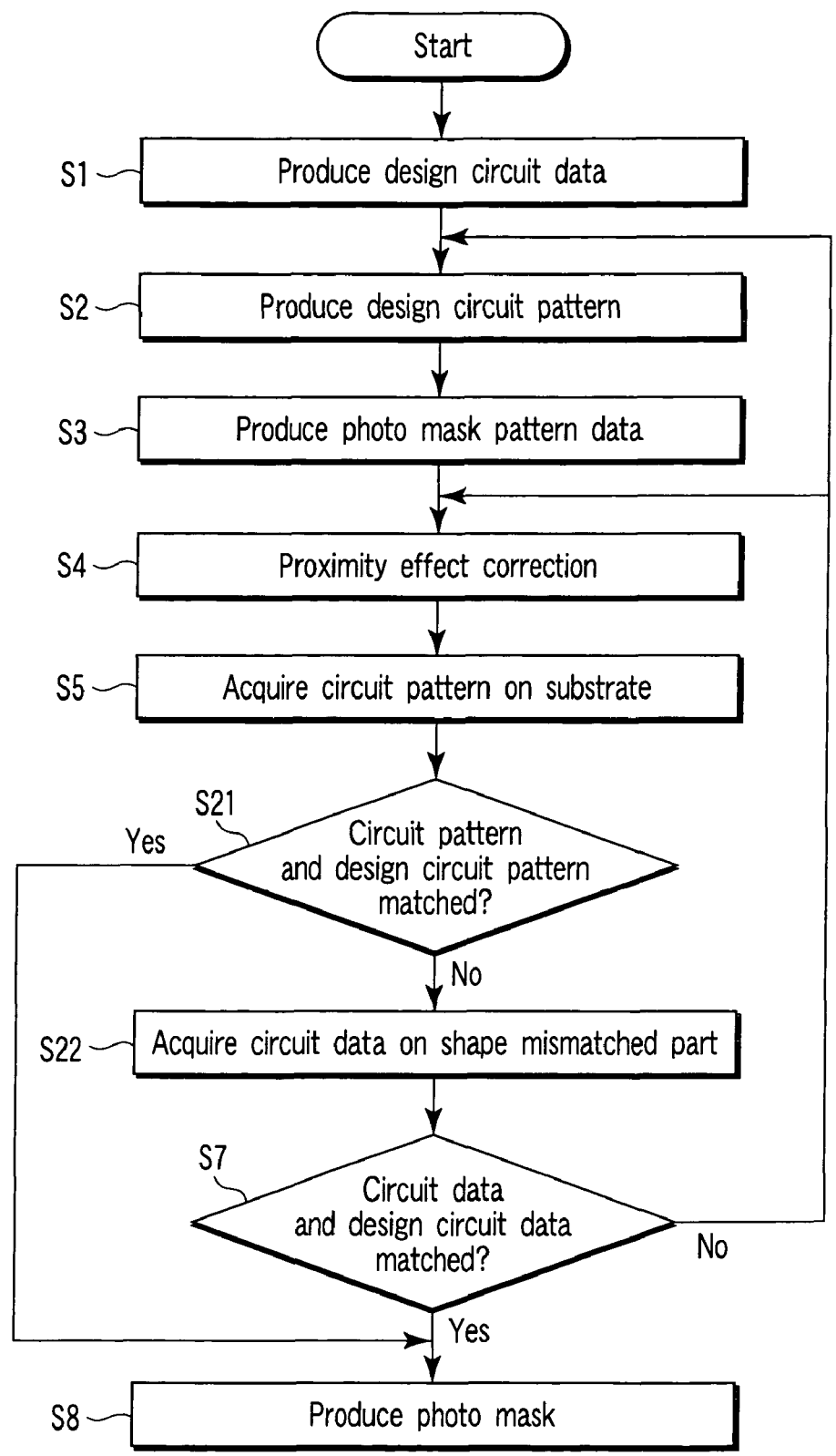
FIG. 9 is a flowchart showing a method for verifying mask pattern data and a method for manufacturing a mask according to a second embodiment.

With reference to FIG. 9, description will be given of a method for verifying (producing) mask pattern data and a method for manufacturing a mask according to a second embodiment of the present invention. FIG. 9 is a flowchart showing the method for verifying mask pattern data and the method for manufacturing a mask according to the second embodiment of the present invention.

As shown in FIG. 9, the processes between steps S1 and S5 are the same as those in the first embodiment. After step 5, the shape of the circuit pattern is compared with that of the design circuit pattern (step S21) to detect parts in which the shape of the circuit pattern is different from that of the design circuit pattern (shape mismatch parts).

In the shape comparison in step S21, mismatching of the shapes may be determined when the line width of the circuit pattern is smaller than that of the design pattern by at least a predetermined threshold and/or when the value of width of a space in the circuit pattern is equal to or larger than a predetermined threshold. Alternatively, the deviation of edge position may be used.

Different thresholds may be set in accordance with verified parts of the circuit pattern. For example, the line width needs to be strictly controlled for a part of a transistor which constitutes a gate electrode and a part of the transistor which is affected by a change in capacity. On the other hand, if strict control is not required, stringent thresholds need not be set.

In the example shown in FIG. 4, although the results depend on the thresholds, the U-shaped part 5 of the circuit pattern is determined to be a shape mismatch part.

In step S21, if no shape mismatch parts are detected, the process shifts to step S8.

On the other hand, if a shape mismatch part is detected, then circuit data on this part is acquired (step S22). The process in step S22 is the same as that described for step S6 except that the target of the detection is limited to the shape mismatch part.

Then, the circuit data on shape mismatch parts are compared with the parts of the design circuit data which corresponds to the shape mismatch parts. Thus, parts whose circuit data does not match the corresponding circuit data is detected among the shape mismatch parts (step S7).

Detection of parts whose circuit data does not match the corresponding circuit data among the shape mismatch parts continues until no more detection occurs for the entire circuit pattern. In other words, if the determination in step 7 is NO, then the design circuit pattern is changed (step S2) or the proximity correction is re-executed after review on the conditions (step S4) so as to allow the mask pattern which is being produced to realize the design circuit.

Acquisition of a circuit pattern in step S5 and production of circuit data in step S22 are carried out again. The processes between steps S2 and S5 and in steps S21, S22, and S7 are repeated until no more detection occurs.

In the example shown in FIG. 4, the part 5 is determined to be a shape mismatch part as described above. However, the circuit data on this part is the same as FIG. 3, that is, the same as the corresponding design circuit data. This indicates that the mismatch between the shape of the circuit pattern and the shape of the design circuit pattern does not hinder the realization of the circuit operation based on the design circuit.

When the circuit data matches the design circuit data in all shape mismatch parts, the process shifts to step S8. Subsequently, as described with reference to FIG. 7, the mask produced in step S8 in FIG. 9 is used to produce a semiconductor device.

In the above description, the mask pattern data which has experienced the proximity correction is verified. However, the mask pattern data not subjected to the proximity correction yet may be checked. In either case, after the verification, shape mismatch parts are subjected to the proximity correction in step S4. Thus, the mask pattern data need not necessarily be subjected to the proximity correction during the initial verification as long as the proximity correction is executed in step S4.

In the second embodiment, steps S1 to S5 and steps S21, S22, and S7 may be executed by the information processing apparatus 11 and an execution program that allows the information processing apparatus 11 to execute these steps, as is the case with the first embodiment.

According to the method for verifying mask pattern data according to the second embodiment, first, shape mismatch parts are detected by comparing the shape of the circuit pattern with that of the design circuit pattern. Then, for the shape mismatch parts, circuit mismatch parts are detected by comparing the circuit data with the design circuit data. Thus, even if the shape of a part of the circuit pattern is determined to be mismatch to the corresponding part of the design circuit pattern, this part will not be corrected as long as the circuit realized by this part is as desired. This reduces the time for verifying (producing) mask pattern data, thus making it possible to provide an efficient method for verifying (producing) mask pattern data.

Third Embodiment

The third embodiment uses different verification methods for respective parts of the circuit pattern.

Figure 10:
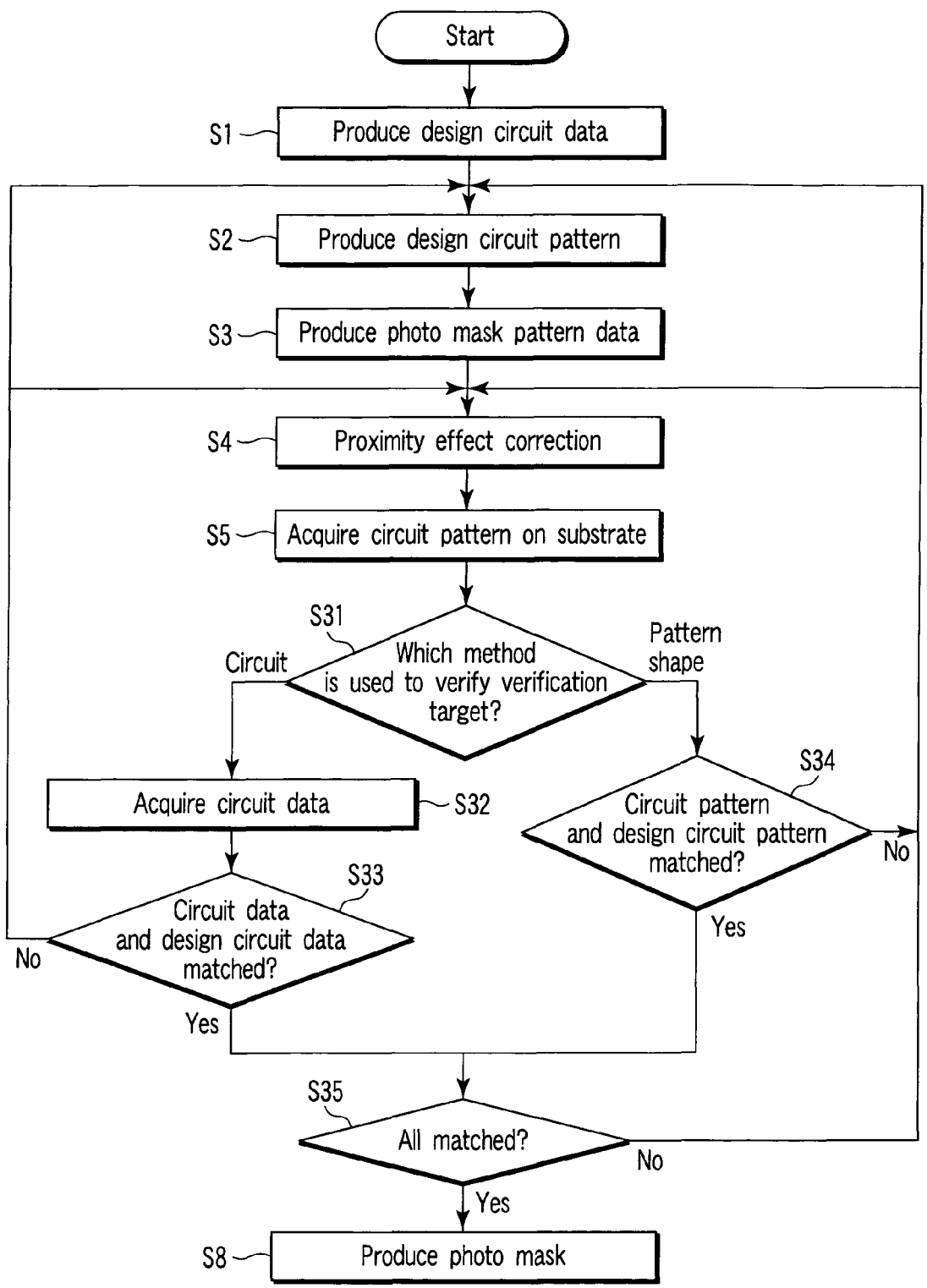
FIG. 10 is a flowchart showing a method for verifying mask pattern data and a method for manufacturing a mask according to a third embodiment.

With reference to FIG. 10, description will be given of a method for verifying (producing) mask pattern data and a method for manufacturing a mask according to a third embodiment of the present invention. FIG. 10 is a flowchart showing the method for verifying mask pattern data and the method for manufacturing a mask according to the third embodiment of the present invention.

As shown in FIG. 10, the processes between steps S1 and S5 are the same as those in the first embodiment. After step S5, the process determines which one is used to verify each part of the circuit pattern between matching of the shape and matching of the circuit data (step S31). This determination is made using, for example, the criterion described below.

As described above, for example for a gate electrode, normal operation as the design circuit requires is insufficient and its width needs to be strictly controlled because the width of the gate electrode contributes greatly to a variation in the performance of the transistor. Parts of wiring whose capacity markedly affects the circuit operation also need to have their widths appropriately controlled. Thus, verification targets are divided into those for which the shape of the circuit pattern should be strictly controlled and those for which the realization of normal circuit operation is the only requirement.

It is desirable to strictly control at least the shape of the conductive layer which is affected by the shape of the gate electrode and a variation in capacity. Accordingly, the other parts can be verified on the basis of matching of the circuit data.

If parts of the circuit pattern to be verified (verification targets) are to be verified on the basis of matching of the circuit data, the process shifts to step S32, where the circuit data on the verification targets is acquired by the same process as that in step S5.

The same process as that in step S7 is then executed to compare the circuit data on the verification targets with the design circuit data on those parts to detect circuit mismatch parts (step S33). If any circuit mismatch part is detected, the process shifts to step S2 or S4 to change (correct) the mask pattern data on the circuit mismatch part or to re-execute the proximity correction.

Figure 11:
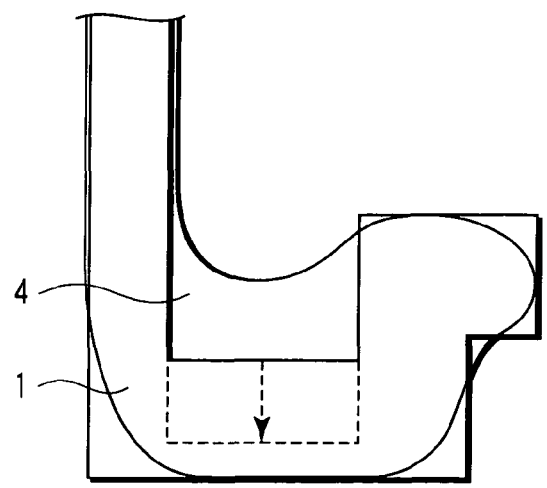
FIG. 11 is a diagram showing an example of correction of a design circuit pattern.

If the part 5 of the gate wiring 1 is verified on the basis of matching of the shape as in the prior art, then the design circuit pattern will be changed in the part 5 or the proximity correction will be re-executed after the conditions have been reviewed. For example, if the design circuit pattern is to be changed, then the width of the design circuit pattern is reduced along the direction of an arrow in FIG. 11. However, this correction may affect the shape of the circuit pattern in other parts. This makes it necessary to carry out verification of the circuit pattern and a change in the design circuit pattern again.

However, the inappropriate shape of the design circuit pattern in the part 5 does not affect the circuit to be realized, and the shape of the part 5 need not be strictly controlled. Accordingly, the shape of the design circuit pattern in the part 5 need not be corrected in the first place. Thus, those parts for which the shape of the circuit pattern need not be strictly controlled are to be subjected only to verifications based on matching of the circuit data. This makes it possible to reduce the effort and time required for originally unwanted corrections.

If the process determines in step S31 that the circuit data on the verification targets are to be verified on the basis of matching of the shape, it shifts to step S34, where the same process as that in step S21 is executed to detect any of the verification targets in which the shape of the circuit pattern does not match that of the design circuit pattern. If any shape mismatch part is detected, the process shifts to step S2 or S4, where the mask pattern data on the shape unmatched part is changed or the proximity correction is re-executed on the mask pattern data.

On the other hand, if no circuit mismatch part is detected in step S33 or if no shape mismatch part is detected in step S34, then the process shifts to step S35. In this step, the process between steps S2 (or S4) and S31 to S34 is repeated until the circuit data matches the design circuit data in all parts or the shape of the circuit pattern matches that of the design circuit pattern in all parts.

When, no more circuit mismatch part or shape mismatch part is detected in the circuit pattern depending on the area to be verified, the process shifts to step S8. Subsequently, as is the case with FIG. 7, a mask produced by the process shown in FIG. 10 is used to manufacture a semiconductor device.

The first proximity correction may be executed after the first verification as is the case with the second embodiment.

Also in the third embodiment, steps S1 to S5 and steps S31 to S35 may be executed by the information processing apparatus 11 and an execution program that allows the information processing apparatus 11 to execute these steps, as is the case with the first embodiment.

With the method for verifying mask pattern data and the method for manufacturing a mask according to the third embodiment, mask pattern data is verified by determining matching of the shape or matching of the circuit depending on which part of the circuit pattern is to be verified. Thus, the correction of the mask pattern data is avoided for parts whose shape of the circuit pattern need not be strictly controlled as long as the circuit data on these parts are appropriate. This reduces the time required to verify (produce) mask pattern data, thus making it possible to provide an efficient method for verifying (producing) mask pattern data.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A computer-implemented method for verifying mask pattern data, the method comprising steps performed by a computer of:

preparing, by the computer, design circuit data for a design circuit which realizes a desired circuit operation;

preparing, by the computer, design circuit pattern data for a design circuit pattern which has geometrical features to realize the design circuit and which is formed on a semiconductor substrate;

preparing, by the computer, mask pattern data for a mask pattern used to etch a film through the mask pattern to produce the design circuit pattern on the substrate;

acquiring, by the computer, a circuit pattern which is expected to be formed after the layer is etched through the mask pattern;

producing, by the computer, circuit data which describes a circuit realized by at least a part of the circuit pattern to be verified and including one of an electrical element, an electrical connection, or a combination thereof; and detecting, by the computer, a circuit mismatch part where the circuit data does not match at least a part of the design circuit data, wherein the circuit mismatch part corresponds to a difference, in at least one of a type of an electrical element or a type of an electrical connection between electrical nodes, between the circuit data and the part of the design circuit data which corresponds to the part of the circuit pattern to be verified.

2. The method according to claim 1, wherein producing circuit data which describes a circuit includes producing the circuit data with connected adjacent two parts which is included in the part of the circuit pattern to be verified when a distance between the two parts is smaller than a threshold.

3. The method according to claim 1, wherein at least one of the following steps is repeated until the circuit mismatch part is no longer detected throughout the circuit pattern:
the preparing design circuit pattern data and the preparing mask pattern data,
the acquiring a circuit pattern,
the producing circuit data, and
the detecting a circuit mismatch part.

4. A method for manufacturing a mask comprising:
producing a mask in accordance with the mask pattern data according to claim 3 which is obtained when the circuit mismatch part is no longer detected throughout the circuit pattern.

5. The method according to claim 1, further comprising detecting a shape mismatch part where shape of the circuit pattern and shape of the design circuit pattern do not match up, and
wherein the shape mismatch part is the part of the circuit pattern to be verified.

6. The method according to claim 5, wherein at least one of the following steps is repeated until the circuit mismatch part is no longer detected throughout the circuit pattern:
the preparing design circuit pattern data and the preparing mask pattern data,
the acquiring a circuit pattern,
the detecting a shape mismatch part,
the producing circuit data, and
the detecting a circuit mismatch part.

7. A method for manufacturing a mask comprising:
producing a mask in accordance with the mask pattern data according to claim 6 which is obtained when the circuit mismatch part is no longer detected throughout the circuit pattern.

8. The method according to claim 1, further comprising detecting a shape mismatch part where mismatch occurs between a shape of at least another part of the circuit pattern to be verified and a shape of a part of the design circuit pattern which corresponds to the another part of the circuit pattern to be verified,
wherein the part of the circuit pattern to be verified or the another part of the circuit pattern to be verified depends on a position or function of the part or the another part of the circuit pattern for the design circuit data.

9. The method according to claim 8, wherein the part of the circuit pattern to be verified is a pattern of a gate electrode of a transistor.

10. The method according to claim 8, wherein at least one of the following steps is repeated until a circuit mismatch part and a shape mismatch part are no longer detected throughout the circuit pattern:
the preparing design circuit pattern data and the preparing mask pattern data,
the acquiring a circuit pattern,
the producing circuit data,
the detecting a circuit mismatch part, and
the detecting a shape mismatch part.

11. A method for manufacturing a mask comprising:
producing a mask in accordance with the mask pattern data according to claim 10 which is obtained when the circuit mismatch part and the shape mismatch part are no longer detected throughout the circuit pattern.

12. The method according to claim 1, wherein the acquiring a circuit pattern includes acquiring data on the circuit pattern by simulation for reproducing conditions under which the film is processed using the mask pattern.

13. The method according to claim 1, wherein the preparing mask pattern data includes executing at least one of optical proximity effect correction and process proximity effect correction.

14. A method for manufacturing a mask comprising:
producing a mask in accordance with the mask pattern data according to claim 1.

15. A method for manufacturing a semiconductor device, the method comprising:
forming a first film above a semiconductor substrate;
forming a second film on the first film;
producing a mask having a pattern using the method for verifying mask pattern data according to claim 1;
placing the mask above the second film;
exposing the second film via the mask to form a pattern corresponding to the pattern of the mask in the second film; and
etching the first film via the second film to form a pattern corresponding to the pattern of the second film in the first film.

16. A tangible computer-readable storage medium storing executable instructions for causing a processor to perform a method for verifying mask pattern data, the method comprising steps of:
preparing, by the processor, mask pattern data for a mask pattern used to etch a film through the mask pattern to produce a design circuit pattern on a semiconductor substrate, the design circuit pattern having geometrical features to realize an intended circuit operation for design circuit;
acquiring, by the processor, a circuit pattern which is expected to be formed after the layer is etched through the mask pattern;
producing, by the processor, circuit data which describes a circuit realized by at least a part of the circuit pattern to be verified and including one of an electrical element, an electrical connection or a combination thereof; and
detecting, by the processor, a circuit mismatch part where the circuit data does not match at least a part of the design circuit data of the intended circuit operation.

17. The tangible computer-readable storage medium according to claim 16, wherein the method further comprises making the processor repeat one of the following steps until the circuit mismatch part is no longer detected throughout the circuit pattern:
the preparing mask pattern data,
the acquiring a circuit pattern,
the producing circuit data, and
the detecting a circuit mismatch part.

18. The tangible computer-readable storage medium according to claim 16, wherein the method further comprises detecting a shape mismatch part where a shape of the circuit pattern and a shape of the design circuit pattern do not match up, and the shape mismatch part is the part of the circuit pattern to be verified.

19. The tangible computer-readable storage medium according to claim 16, wherein the method further comprises detecting a shape mismatch part where mismatch occurs between a shape of at least another part of the circuit pattern to be verified and a shape of a part of the design circuit pattern which corresponds to the another part of the circuit pattern to be verified, the part of the circuit pattern to be verified or the another part of the circuit pattern to be verified depends on a position or function of the part or the another part of the circuit pattern for the design circuit data.

* * * * *